US006548757B1

(12) United States Patent
Russell et al.

(10) Patent No.: US 6,548,757 B1
(45) Date of Patent: Apr. 15, 2003

(54) MICROELECTRONIC DEVICE ASSEMBLIES HAVING A SHIELDED INPUT AND METHODS FOR MANUFACTURING AND OPERATING SUCH MICROELECTRONIC DEVICE ASSEMBLIES

(75) Inventors: Ernest J. Russell, McKinney, TX (US); Bharath Nagabhushanam, Boise, ID (US); Terry Lee, Boise, ID (US); Roger Norwood, McKinney, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/649,765

(22) Filed: Aug. 28, 2000

(51) Int. Cl.⁷ .............................................. H01L 23/02
(52) U.S. Cl. ...................... 174/52.4; 257/676; 257/691
(58) Field of Search .............................. 174/52.2, 52.4; 257/691, 676; 361/772, 773

(56) References Cited

U.S. PATENT DOCUMENTS

| | | | |
|---|---|---|---|
| 4,551,789 A | 11/1985 | Schettler et al. | |
| 5,214,845 A | 6/1993 | King et al. | |
| 5,278,524 A | 1/1994 | Mullen | |
| 5,473,198 A | * 12/1995 | Hagiya et al. | 257/786 |
| 5,696,667 A | 12/1997 | Berding | |
| 5,847,451 A | 12/1998 | Ohtaki et al. | |
| 5,854,534 A | 12/1998 | Beilin et al. | |
| 5,859,474 A | 1/1999 | Dordi | |
| 5,886,409 A | 3/1999 | Ishino et al. | |
| 5,903,050 A | 5/1999 | Thurairajaratnam et al. | |
| 5,952,726 A | 9/1999 | Liang | |
| 6,046,496 A | 4/2000 | Corisis et al. | |
| 6,048,753 A | 4/2000 | Farnworth et al. | |
| 6,064,113 A | 5/2000 | Kirkman | |
| 6,072,126 A | 6/2000 | Shiga et al. | |
| 6,079,620 A | 6/2000 | Wu et al. | |
| 6,096,980 A | 8/2000 | Ferry | |
| 6,103,548 A | 8/2000 | Miks et al. | |
| 6,144,089 A | * 11/2000 | Corisis | 257/691 |
| 6,229,202 B1 | 5/2001 | Corisis | |
| 6,232,666 B1 | 5/2001 | Corisis et al. | |
| 6,249,047 B1 | 6/2001 | Corisis | |

OTHER PUBLICATIONS

U.S. patent application Ser. No. 09/883,609, Corisis, filed Jun. 18, 2001.
U.S. patent application Ser. No. 09/388,706, Corisis, filed Sep. 2, 1999.

* cited by examiner

Primary Examiner—Hung V. Ngo
(74) Attorney, Agent, or Firm—Perkins Coie LLP

(57) ABSTRACT

Microelectronic devices having a protected input and methods for manufacturing such microelectronic devices. A microelectronic device has a microelectronic die and a support structure for coupling the die to voltage and signal sources. The microelectronic die can have integrated circuitry and a plurality of bond-pads coupled to the integrated circuitry. The bond-pads, for example, can include a reference voltage (Vref) bond-pad and a signal bond-pad adjacent to the Vref bond-pad. The signal bond-pad can be for a clock signal, a data signal, a strobe signal, an address signal, or another type signal for operating the integrated circuitry. The support structure can be a lead frame or a interposing substrate having a plurality of conductive members coupled to the bond-pads of the die. The conductive members can accordingly be metal pins in the case of lead frames or traces and solder ball-pads in the case of interposing substrates. Each conductive member can have a first end with a bond-site proximate to a corresponding bond-pad of the die, a second end defining an external connector, and an elongated conductive section connecting the bond-site to the external connector. The conductive members are generally arranged so that at least some of the bond-sites are arranged in a first row in which the bond-sites and a portion of the elongated sections are spaced apart from one other by a first gap width. The support structure can more specifically include a first conductive member having a first bond-site coupled to the Vref bond-pad by a first wire-bond line and a second conductive member having a second bond-site coupled to the signal bond-pad by a second wire-bond line. The first bond-site of the first conductive member can be spaced apart from the second bond-site of the second conductive member by a second gap width greater than the first gap width.

24 Claims, 5 Drawing Sheets

MICROELECTRONIC DEVICE ASSEMBLIES HAVING A SHIELDED INPUT AND METHODS FOR MANUFACTURING AND OPERATING SUCH MICROELECTRONIC DEVICE ASSEMBLIES

TECHNICAL FIELD

The present invention relates to microelectronic device assemblies, and more specifically to inhibiting or preventing fluctuations in a reference voltage applied to a microelectronic die.

BACKGROUND

Microelectronic devices are generally complex, delicate components used in larger products. A typical microelectronic device includes a microelectronic die, a support structure attached to the die, and a protective casing encapsulating the die. The microelectronic die can be a semiconductor device (e.g., a microprocessor or a memory device), a field emission display, or another type of device. The support structure is generally a lead frame having a plurality of leads, or an interposing substrate having electrically conductive traces and solder ball pads. The protective casing is generally a hard plastic, such as a thermosetting material, that is molded around the die. The protective casing encapsulates the die and a portion of the support structure to protect the die from environmental hazards and physical shocks.

The microelectronic dies include integrated circuitry and a plurality of bond-pads that are coupled to the integrated circuitry. In a typical application for a DRAM memory device, a die will have a reference voltage (Vref) bond-pad, a plurality of supply voltage ($V_{dd}$) and ground voltage ($V_{ss}$) bond-pads, a plurality of signal bond-pads (e.g., clock lines, address lines, and data lines), a column address strobe ($\overline{CAS}$) bond-pad, and a row address strobe ($\overline{RAS}$) pad. The bond-pads are often arranged in a fine pitch array on one side of the die, and each bond-pad is coupled to the appropriate voltage source or signal source. For example, the Vref bond-pad is coupled to a reference voltage source, the Vss and Vdd bond-pads are coupled to appropriate electrical potentials, and the signal bond-pads are coupled to the correct signal sources. The support structures are accordingly configured so that the leads or traces couple the bond-pads on the die to the corresponding voltage and signal sources.

The current trend in microchip fabrication is to manufacture smaller and faster microelectronic dies for computers, cell phones and many other products. As the dies become smaller, the bond-pads on the dies are also smaller and spaced closer together. Additionally, as the microelectronic dies become faster and have a larger capacity, the components of the integrated circuitry are much smaller and spaced closer together so that more components can be fabricated in the dies. Many dies accordingly have a limited amount of real estate for the integrated circuitry and the bond-pads. As a result, the Vref bond-pad may be adjacent to a signal bond-pad for a data or clock signal such that the wire-bond lines between these bond-pads are immediately adjacent to one another.

One drawback of locating the Vref bond-pad adjacent to a signal bond-pad is that the reference voltage may fluctuate because of coupled noise. This drawback is particularly problematic in high-frequency dies with clock speeds of over 100 MHz and signal frequencies of over 200 MHz. Such fluctuations in the reference voltage at the Vref bond-pad can cause the microelectronic die to malfunction because it is critical to maintain a constant reference voltage. Therefore, it would be desirable to prevent fluctuations in the reference voltage at the Vref bond-pad in microelectronic dies that have the Vref bond-pad in the proximity of a signal bond-pad.

SUMMARY

The present invention is directed toward microelectronic devices and methods for manufacturing such microelectronic devices. One aspect of the invention is directed toward a microelectronic device having a microelectronic die and a support structure for coupling the die to voltage sources and signal sources. The microelectronic die can have integrated circuitry and a plurality of bond-pads coupled to the integrated circuitry. The bond-pads, for example, can include a reference voltage (Vref) bond-pad and a signal bond-pad adjacent to the Vref bond-pad. The signal bond-pad can be for a clock signal, a data signal, a strobe signal, an address signal, or another type signal for operating the integrated circuitry.

The support structure can be a lead frame or an interposing substrate having a plurality of conductive members coupled to the bond-pads of the die. The conductive members can accordingly be metal leads in the case of lead frames or traces connected to solder ball-pads in the case of interposing substrates. Each conductive member can have a first end with a bond-site proximate to a corresponding bond-pad of the die, a second end defining an external connector, and an elongated conductive section connecting the bond-site to the external connector. The conductive members are generally arranged so that at least some of the bond-sites are arranged in a first row in which the bond-sites and a portion of the elongated sections are spaced apart from one other by a first gap width. The support structure can more specifically include a first conductive member having a first bond-site coupled to the Vref bond-pad by a first wire-bond line and a second conductive member having a second bond-site coupled to the signal bond-pad by a second wire-bond line. The first bond-site of the first conductive member can be spaced apart from the second bond-site of the second conductive member by a second gap width greater than the first gap width.

In one particular embodiment of a microelectronic device, the support structure includes a first conductive member, a second conductive member, and a third conductive member. The first conductive member has a first elongated section and a first bond-site coupled to the Vref bond-pad by a first wire-bond line, and the second conductive member has a second elongated section and a second bond-site coupled to the signal bond-pad by a second wire-bond line. The third conductive member has a shielding section adjacent to and between the first and second bond-sites of the first and second conductive members. The shielding section of the third conductive member can also extend between a portion of the first and second elongated sections of the first and second conductive members. The third conductive member of this particular embodiment can be coupled to an electrical potential, such as the ground voltage, to establish an electrical shield that inhibits or even prevents electrical interference between a high-frequency input/output signal applied to the second conductive member and the reference voltage applied to the first conductive member.

DETAILED DESCRIPTION

The following disclosure is directed towards microelectronic devices, and to methods and apparatuses for operatively coupling a microelectronic die to voltage and signal sources. Several embodiments of the present invention are described with respect to memory devices, but the methods and apparatuses are also applicable to other types of microelectronic devices. One skilled in the art will accordingly understand that the present invention may have additional embodiments, or that the invention may be practiced without several of the details described below.

A. Related Art Microelectronic Device Assembly

The embodiments of the microelectronic devices in accordance with the invention are best understood in light of an initial design for a microelectronic device that Micron Technology, Inc. developed, but did not put produce commercially or use in public. As such, the initial design is described with respect to FIG. 1, and embodiments of microelectronic devices in accordance with the invention are described in FIGS. 2A–4.

Figure 1:
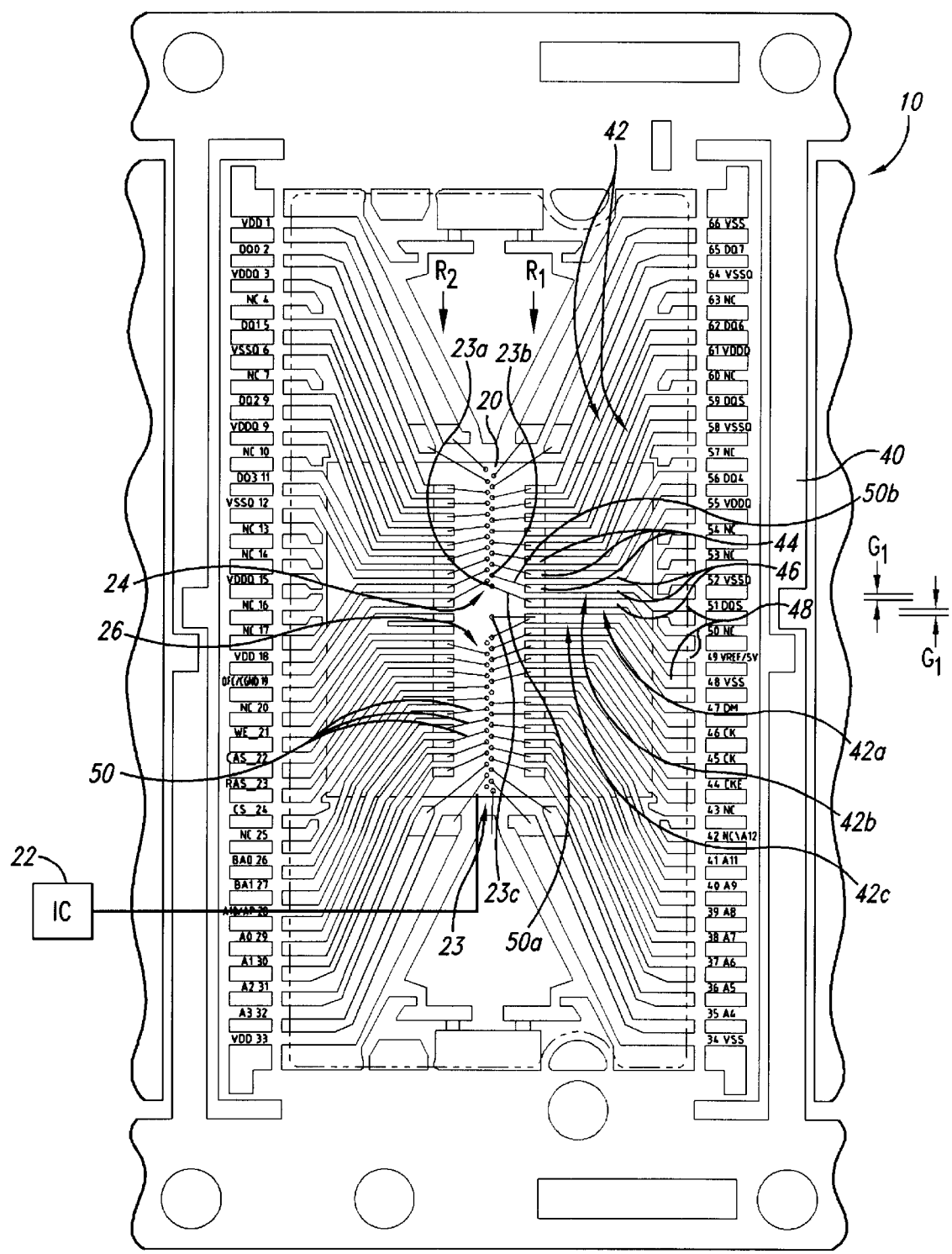
FIG. 1 is a top plan view of a microelectronic device assembly having a die coupled to a lead frame in accordance with related art developed by Micron Technology, Inc.

FIG. 1 is a top plan view of a microelectronic device assembly 10 having a microelectronic die 20 coupled to a support member 40. The microelectronic die 20 shown in FIG. 1 is a 128M Double Data Rate (DDR) DRAM memory device. Suitable DDR devices and other types of memory devices are manufactured by Micron Technology, Inc. The microelectronic die 20 can also be a microprocessor or another type of microelectronic device. The support structure 40 electrically couples the microelectronic die to input/output signals, clock signals, strobe signals, a reference voltage source, a supply, voltage source, a ground voltage source, and other types of voltage and signal sources. In a completed device, the die 20 and a portion of the support structure 40 are encapsulated in a protective cover (not shown), and the support structure 40 is trimmed to electrically isolate the leads.

The die 20 shown in FIG. 1 includes integrated circuitry 22 and a plurality of bond-pads 23 coupled to the integrated circuitry 22. The bond-pads 23 can be arranged in a first center array 24 and a second center array 26. The bond-pads 23 correspond to the particular voltage and signal sources that drive the integrated circuitry 22 of the microelectronic die 20. In this embodiment, the bond-pads 23 include a reference voltage (Vref) bond-pad 23a, a signal bond-pad 23b proximate to the Vref bond-pad 23a, a ground voltage ($V_{ss}$) bond-pad 23c, and several additional bond-pads for operating other functions of the die 20. The arrangement of the bond-pads 23 can be determined by the design of the integrated circuitry 22 in the die 20 and/or the pin-sites for providing the voltage and signal sources to the die 20. As a result, it may be necessary to locate the Vref bond-pad 23a next, or at least near, to the signal bond-pad 23b to accommodate the particular structure of the integrated circuitry 22 and the configuration of the pin-sites. In the embodiment shown in FIG. 1, the signal bond-pad 23b is a data I/O bond-pad for signals that operate at a high frequency.

Because of the arrangement of the bond-pads 23, the Vref bond-pad 23a and the signal bond-pad 23b are coupled to respective adjacent leads of the support structure 40.

The support structure 40 shown in FIG. 1 is a lead frame having a plurality of conductive members 42. Each conductive member 42 can be a lead having a first end with a bond-site 44, an elongated conductive section 46, and a second end with an external connector 48. The elongated conductive section 46 extends from the bond-site 44 to the external connector 48. The conductive members 42 are arranged so that at least a portion of the bond-sites 44 are arranged in a first row $R_1$, and the conductive members 42 are more preferably arranged so that the bond-sites 44 are arranged in the first row $R_1$ along one side of the die 20 and a second row $R_2$ along another side of the die 20. The bond-sites 44 in the first and second rows $R_1$ and $R_2$ are positioned proximate to the interior bond-pads 23 in the first and second center arrays 24 and 26. The bond-sites 44 in the first and second rows $R_1$ and $R_2$ are generally spaced apart from adjacent bond-sites 44 by a first gap width $G_1$. The conductive members 42 are also configured so that the external connectors 48 are proximate to a pin-site for a voltage, address, clocking, strobing, and data input/output function corresponding to the bond-pads 23 on the die 20. For example, the conductive member 42 having a bond-site 44 adjacent to the Vref bond-pad 23a on the die 20 has an elongated section 46 configured to position the external connector 48 at a pin-site "49 VREF/SV" that is to be coupled to a reference voltage source.

The support structure 40 can include a first conductive member 42a for connecting the Vref bond-pad 23a to the reference voltage source, a second conductive member 42b for coupling the signal bond-pad 23b to a data signal source, and a third conductive member 42c for coupling the ground voltage bond-pad 23c to the ground voltage source. Because the Vref bond-pad 23a is proximate to the signal bond-pad 23b, the bond-sites 44 and a significant length of the elongated sections 46 of the first and second conductive members 42a and 42b are immediately adjacent to one another. When the die 20 is very small and operates at a high frequency, the spacing between the bond-sites 44 and the elongated sections 46 of the conductive members 42 is also very small.

The microelectronic device assembly 10 also includes a plurality of wire-bond lines 50 that couple the bond-pads 23 to corresponding bond-sites 44 of the conductive members 42. For example, the Vref bond-pad 23a is coupled to the bond-site 44 of the first conductive member 42a by a first wire-bond line 50a, and the signal bond-pad 23b is coupled to the bond-site 44 of the second conductive member 42b by a second wire-bond line 50b. The first and second wire-bond lines 50a and 50b are adjacent to one another without an interposing wire-bond line positioned between them. The first and second bond lines 50a and 50b are configured in this arrangement because the Vref bond-pad 23a is adjacent to the signal bond-pad 23b along a common side of the first center array 24 on the die 20. The remaining bond-pads 23 are similarly coupled to corresponding bond-sites 44 of selected conductive members 42 to accurately couple the bond-pads 23 to pin-sites for the appropriate voltage and signal sources.

One concern of the microelectronic device assembly 10 shown in FIG. 1 is that the reference voltage provided to the Vref bond-pad 23a may fluctuate. The reference voltage fluctuates because of capacitive and/or inductive coupling effects, and this error in the reference voltage level can create critical skews in signals at higher operating frequencies (i.e., 266 Mbps). It will be appreciated that such fluctuations in the reference voltage can impair the efficacy of the microelectronic device assembly 10.

B. Microelectronic Devices with a Protected Conductive Member

Figure 2A:
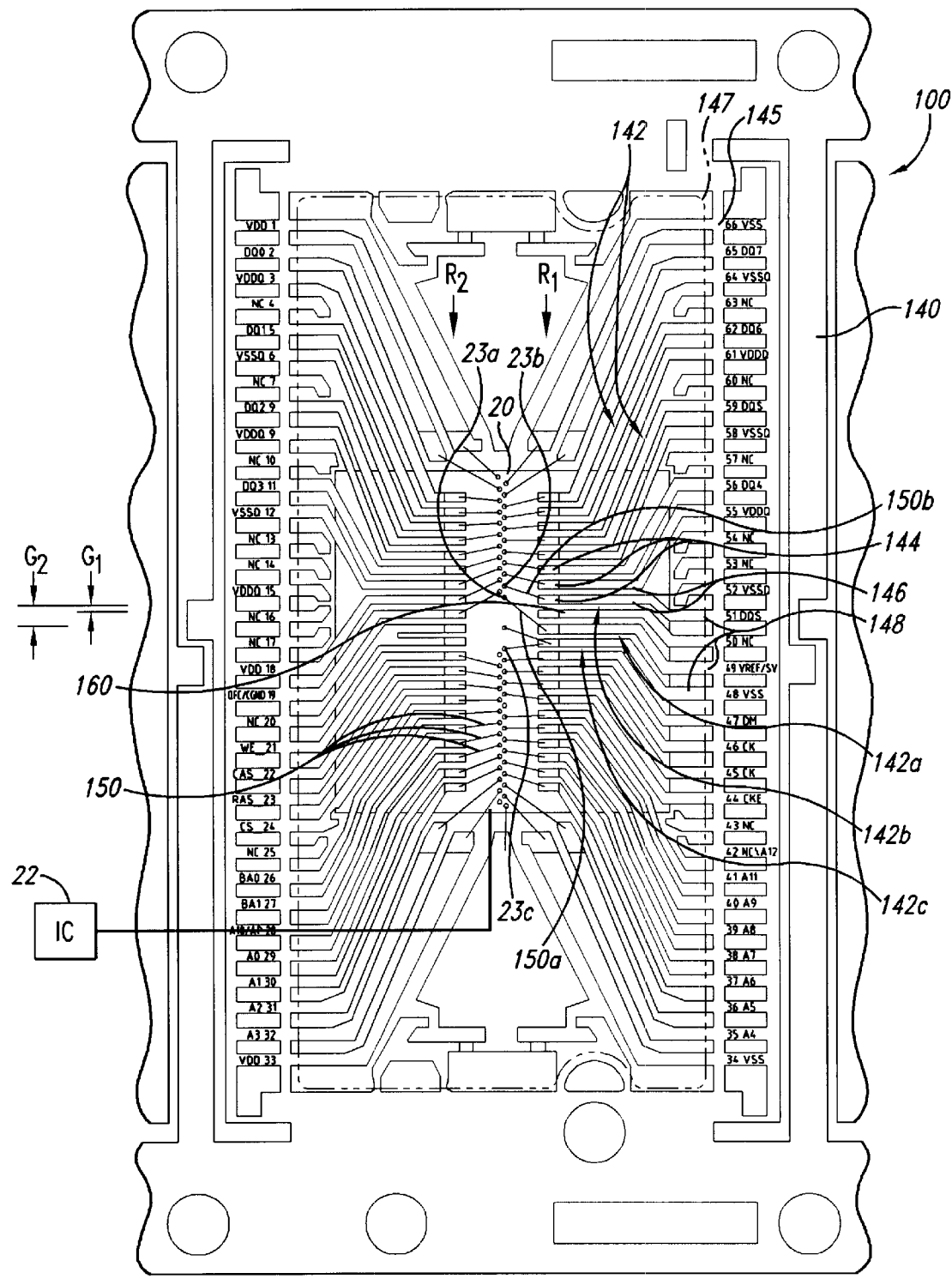
FIGS. 2A and 2B are top plan views of microelectronic device assemblies having a die and a lead frame in accordance with embodiments of the invention.

FIG. 2A is a top plan view of a microelectronic device assembly 100 having a support structure 140 in accordance with an embodiment of the invention coupled to the microelectronic die 20. The microelectronic die 20 can be substantially the same as the die 20 shown in FIG. 1, and some of the components of the support structure 140 can be similar to the components of the support structure 40 shown in FIG. 1. As such, like reference numbers refer to like parts in FIGS. 1 and 2.

The embodiment of the support structure 140 shown in FIG. 2A is a lead frame having a plurality of conductive members 142. Each conductive member 142 can include a bond-site 144, an elongated section 146, and an external connector 148. The configuration of the conductive members 142 in the support structure 140 is different than that in the support structure 40 shown in FIG. 1. More specifically, the pin-site "43 NC" in FIG. 1 for a vacant non-contact external connector 48 on the support structure 40 has a conductive member 42, but the pin-site "43 NC" on the support structure 140 in FIG. 2 does not have a conductive member 142. The bond-sites 144 of the conductive members 142 for the reference voltage at pin-site "49 VREF/SV," the ground voltage at pin-site "48 VSS," the data input signal at pin-site "47 DM," the clock signal at pin-site "46 CK," the CAS clock signal at pin-site "45 CK," and the RAS clock signal at pin-site "44 CKE" have all been shifted down along the first row $R_1$. As a result, the bond-sites 144 of the conductive members 142 arranged along the first row $R_1$ can be spaced apart from one another by the first gap width $G_1$, but the first bond-site 144 of the first conductive member 142a is spaced apart from the second bond-site 144 of the second conductive member 142b by a second gap width $G_2$ that is greater than the first gap width $G_1$. The second gap width $G_2$ can be double the first gap width $G_1$, but the second gap width $G_2$ can be any suitable gap width that shields the first conductive member 142a from the capacitive coupling and/or inductive affects caused by applying a high-frequency signal to the second conductive member 142b.

The first conductive member 142a is coupled to the Vref bond-pad 23a by a first wire-bond line 150a, and the second conductive member 142b is coupled to the signal bond-pad 23b by a second wire-bond line 150b. The first and second wire-bond lines 150a and 150b are immediately adjacent to each other such that another wire-bond line is not between the first and second wire-bond lines 150a and 150b. The wire-bond lines 150a and 150b can be constructed using equipment and techniques known in the microchip fabrication arts.

The support structure 140 shown in FIG. 2A can also include a shield 160 in the large second gap width $G_2$ between the first conductive member 142a and the second conductive member 142b. The shield 160 can be coupled to a supply voltage or a ground voltage, or the shield 160 can be a non-contact member that is not connected to a voltage source or a signal source. When the shield 160 is coupled to a ground voltage, the second gap width $G_2$ can generally be reduced to maximize the density of leads on the support structure 140. In an alternative embodiment, the second gap width $G_2$ between the first and second conductive members 142a and 142b can be completely vacant without the shield 160 (shown in FIG. 2B).

Referring again to FIG. 2A, the support structure 140 can also include a perimeter frame 145 connected to the conductive members 142 proximate to the external connectors 148. After the die 20 and a portion of the conductive members 142 are encapsulated with a protective cover (not shown), the conductive members 142 are trimmed along a trim line 147 to remove the perimeter frame 145 from the conductive members 142. The external connectors 148 project from the protective cover after trimming the conductive members 142 to provide external electrical connections for the microelectronic device 100.

Figure 2B:
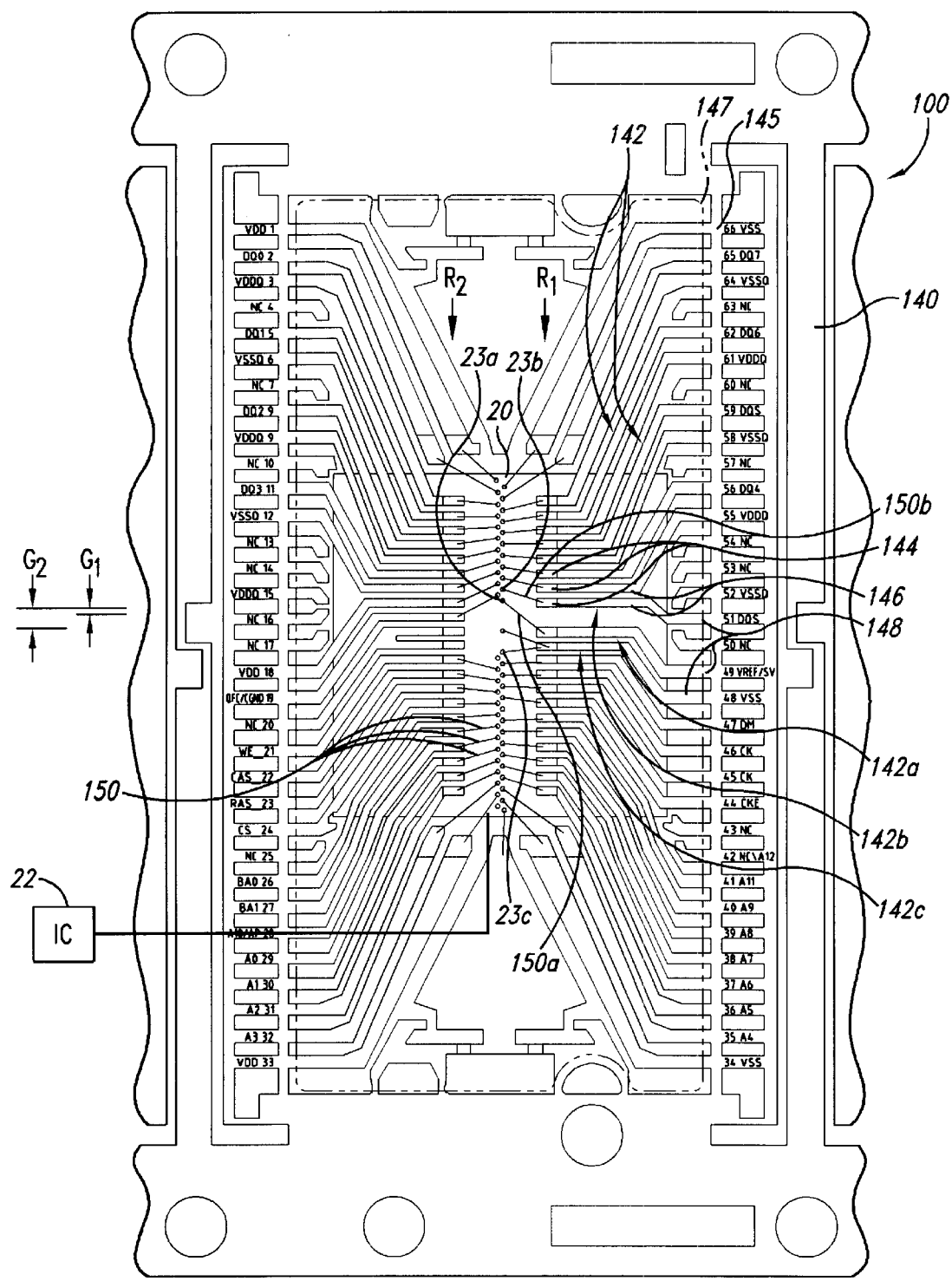

The embodiments of the support structure 140 shown in FIGS. 2A and 2B inhibit or prevent fluctuations in the reference voltage applied to the first conductive member 142a. By separating the first conductive member 142a from the second conductive member 142b by a distance that is greater than the first gap width $G_1$, the capacitive coupling or inductive influences generated by applying high-frequency signals to the second conductive member 142b are reduced at the first conductive member 142a. Moreover, when a voltage potential is applied to the shield 160, it actively protects the reference voltage on the first conductive member 142a from the signals applied to the second conductive member 142b. As such, the support member 140 protects the reference voltage applied to the first conductive member 142a even when Vref bond-pad 23a and the signal bond-pad 23b are arranged on the die 20 such that the first and second wire-bond lines 150a and 150b are adjacent to one another without an interposing wire-bond line between them.

Figure 3:
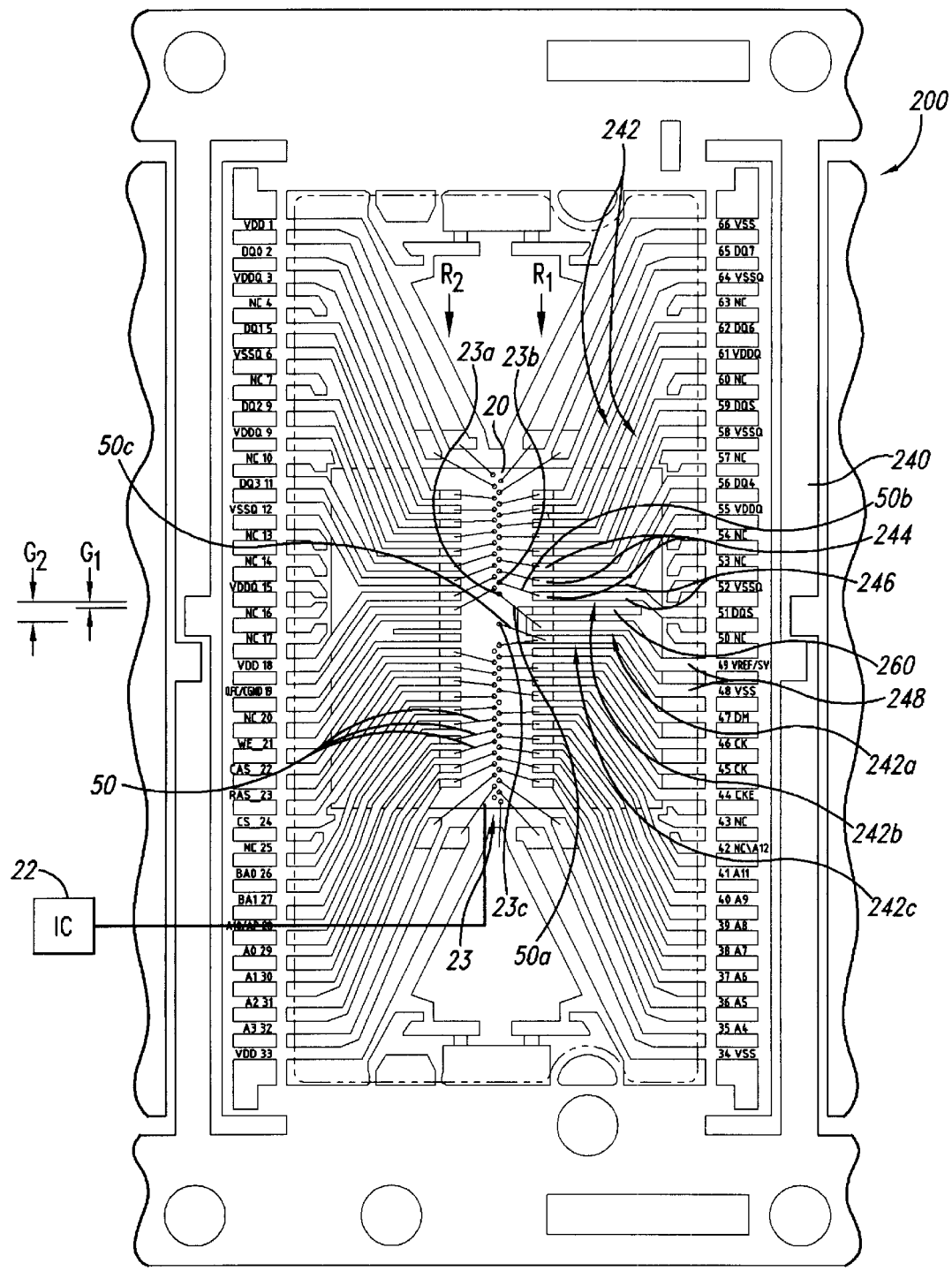
FIG. 3 is a top plan view of a microelectronic device assembly having a die and a lead frame in accordance with another embodiment of the invention.

FIG. 3 is a top plan view of a microelectronic device assembly 200 having a support structure 240 in accordance with another embodiment of the invention coupled to the microelectronic die 20. The microelectronic die 20 can be the same as described above with reference to FIG. 1, and the support structure 240 can be similar to the support structures 40 and 140 shown in FIGS. 1 and 2. As such, like reference numbers correspond to like parts in FIGS. 1–3.

The embodiment of the support member 240 shown in FIG. 3 is another lead frame having a plurality of conductive members 242. Each conductive member 242 can have a bond-site 244, an elongated conductive section 246, and a connector 248. The support structure 240 can include a first conductive member 242a for the Vref bond-pad 23a and a second conductive member 242b for the signal bond-pad 23b. The first conductive member 242a is spaced apart from the second conductive member 242b by the second gap width $G_2$. The support member 240 can also include a third conductive member 242c having a shielding section 260 between the bond-sites 244 and at least a portion of the elongated sections 246 of the first and second conductive members 242a and 242b. The third conductive member 242c can be coupled to a supply or ground voltage to provide an electrical potential adjacent to and between the first conductive member 242a and the second conductive member 242b. When the third conductive member 242c is coupled to a ground voltage, the shielding section 260 electrically shields the reference voltage applied to the first conductive member 242a from the high-frequency signals applied to the second conductive member 242b. The support member 240, therefore, facilitates providing a constant reference voltage to the Vref bond-pad 23a even when the Vref bond-pad 23a is proximate to the signal bond-pad 23b such that the first and second wire-bond lines 50a and 50b are adjacent to one another without an interposing wire-bond line between them.

Figure 4:
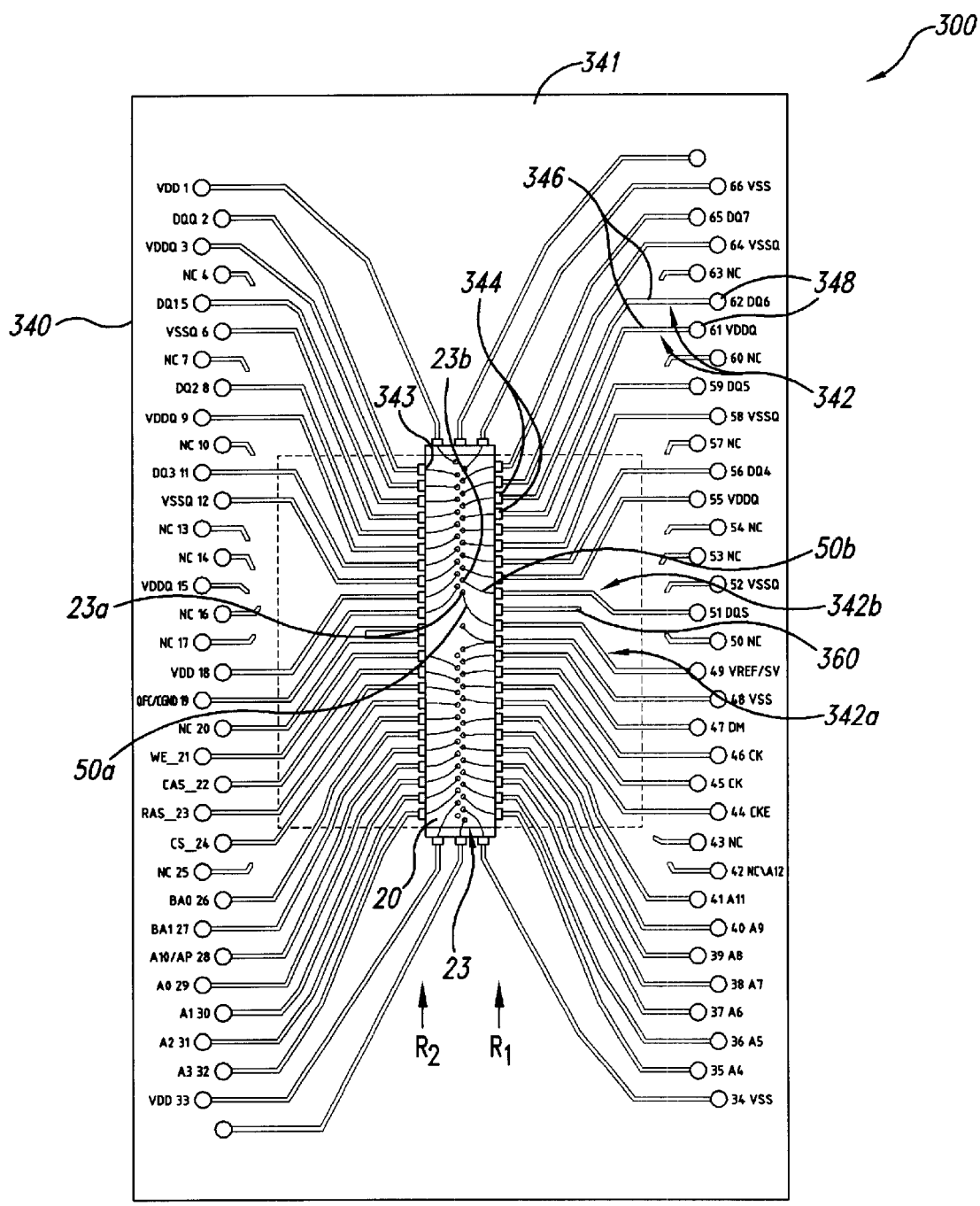
FIG. 4 is a top plan view of a microelectronic device assembly having a die and an interposing substrate for a ball-grid array in accordance with an embodiment of the invention.

FIG. 4 is a top plan view of a microelectronic device 300 having a support structure 340 for a ball-grid array in accordance with another embodiment of the invention coupled to the microelectronic die 20. The microelectronic die 20 can be substantially the same as the die 20 shown in FIGS. 1–3, and thus like reference numbers refer to like parts in FIGS. 1–4.

The embodiment of the support structure 340 shown in FIG. 4 has an interposing substrate 341 and a plurality of conductive members 342 for a ball-grid array used in flip-chip, board-on-chip, chip-on-board, or other techniques for coupling the die 20 to the voltage sources and signal sources. The interposing substrate 341 can be a printed circuit sheet, such as a printed circuit board, tape, or ribbon, that has a plurality of electrical traces and pads "printed" on the sheet. The interposing substrate 341 can have several electrically isolated planes, such as a source voltage plane, a ground voltage plane, and other planes. In the embodiment shown in FIG. 4, the interposing substrate 341 also has an opening 343 to provide access to the bond-pads 23 on the die 20. Each conductive member 342 can include a bond-site 344, a conductive elongated section 346 coupled to the bond-site 344, and an external connector 348 coupled to the elongated section 346. The bond-sites 344 can be contact pads along the sides of the opening 343, and the external connectors 348 can be ball-pads of a ball-grid array for receiving solder balls. The conductive elongated sections 346 can accordingly be conductive traces that extend from the bond-sites 344 to the external connectors 348.

The conductive members 342 can be arranged in any of the arrangements for the conductive members 142 shown in FIGS. 2A–2B. In the embodiment shown in FIG. 4, the conductive members 342 have a shield 360 between a first conductive member 342a coupled to the Vref bond-pad 23a and a second conductive member 342b coupled to the signal bond-pad 23b. The shield 360 can be coupled to the ground voltage plane of the interposing substrate 341 to provide an electrical shield between the first and second conductive members 342a and 342b. As a result, the reference voltage applied to the first conductive member 342a is protected from the high-frequency signal applied to the second conductive member 342b.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. A microelectronic device assembly, comprising:
   a microelectronic die having an integrated circuit and a plurality of bond-pads coupled to the integrated circuit, the bond-pads including a reference voltage (Vref) bond-pad and a signal bond-pad immediately adjacent to the Vref bond-pad; and
   a support structure having a plurality of conductive members coupled to the die, the conductive members having a first end with a bond-site proximate to a corresponding bond-pad of the die, a second end with an external connector, and an elongated section connecting the bond-site to the external connector, the conductive members being arranged so that at least a portion of the bond-sites are arranged in a first row and spaced apart from one another by a first gap distance, and the conductive members including a first conductive member having a first bond-site coupled to the Vref bond-pad and a second conductive member having a second bond-site coupled to the signal bond-pad, the first bond-site of the first conductive member being spaced apart from the second bond-site of the second conductive member by a second distance greater than the first distance.

2. The microelectronic device assembly of claim 1 wherein the support structure is a lead frame comprising a perimeter frame section and the plurality of conductive members, wherein the plurality of conductive members are leads attached to the perimeter frame section proximate to the second ends of the conductive members.

3. The microelectronic device assembly of claim 1 wherein the support structure is an interposing substrate comprising a printed circuit sheet and the plurality of conductive members, the printed circuit sheet having an opening with a first side and a second side, and wherein the bond-sites of the conductive members are contact pads arranged along at least one of the first side or the second side of the opening through the sheet, the external connectors of the conductive members are solder ball-pads, and the elongated sections of the conductive members are conductive traces extending from the bond-sites to the ball-pads.

4. The microelectronic device assembly of claim 1, further comprising a shield between the first and second conductive members.

5. The microelectronic device assembly of claim 4 wherein the shield between the first and second conductive members comprises a conductive line coupled to a voltage potential.

6. The microelectronic device assembly of claim 4 wherein the shield between the first and second lines comprises a dielectric barrier.

7. A microelectronic device assembly, comprising:
   a microelectronic die having an integrated circuit and a plurality of bond-pads coupled to the integrated circuit, the bond-pads including a reference voltage (Vref) bond-pad and a signal bond-pad proximate to the Vref bond-pad; and
   a support structure having a plurality of conductive members coupled to the die, the conductive members including a first conductive member having a first elongated section and a first bond-site coupled to the Vref bond-pad by a first wire-bond line, a second conductive member having a second elongated section and a second bond-site coupled to the signal bond-pad by a second wire-bond line immediately adjacent to the first wire-bond line without an interposing wire-bond line from another bond-pad on the microelectronic die being between the first and second wire-bond lines, and a third conductive member having a third elongated section, wherein a portion of the first elongated section proximate to the first bond-site is immediately adjacent to and spaced apart from an adjacent portion of the third elongated section by a first distance, and wherein the portion of the first elongated section proximate to the first bond-site is spaced apart from a portion of the second elongated section proximate to the second bond-site by a second distance that is greater than the first distance.

8. The microelectronic device assembly of claim 7 wherein the support structure is a lead frame comprising a perimeter frame section and the plurality of conductive members, and wherein the plurality of conductive members are leads attached to the perimeter frame section proximate to the second ends of the conductive members.

9. The microelectronic device assembly of claim 7 wherein the support structure is an interposing substrate comprising a printed circuit sheet and the plurality of conductive members, the printed circuit sheet having an opening with a first side and a second side, the conductive members further comprising ball-pads coupled to individual elongated sections, and wherein the bond-sites of the conductive members are contact pads arranged along at least one of the first side or the second side of the opening through the sheet, and the elongated sections of the conductive members are conductive traces along the sheet extending from the bond-sites to the ball-pads.

10. The microelectronic device assembly of claim 7, further comprising a shield between the first and second conductive members.

11. The microelectronic device assembly of claim 10 wherein the shield between the first and second conductive members comprises the adjacent portion of the third elongated section that is adjacent to the portion of the first elongated section proximate to the first bond-site.

12. The microelectronic device assembly of claim 10 wherein the shield between the first and second lines comprises a dielectric barrier.

13. A microelectronic device assembly, comprising:
a microelectronic die having an integrated circuit and a plurality of bond-pads coupled to the integrated circuit, the bond-pads including a reference voltage (Vref) bond-pad and a signal bond-pad proximate to the Vref bond-pad;
a support structure having a plurality of conductive members coupled to the die, the conductive members having a first end with a bond-site proximate to a corresponding bond-pad of the die, a second end defining an external connector, and an elongated section connecting the bond-site to the external connector, the conductive members being arranged so that at least a portion of the bond-sites are arranged in a first row and spaced apart from one another by a first gap width, and the conductive members including a first conductive member having a first bond-site and a second conductive member having a second bond-site, the first bond-site of the first conductive member being spaced apart from the second bond-site of the second conductive member by a second gap width greater than the first gap width; and
a plurality of wire-bond lines including a first wire-bond line from the Vref bond-pad to the first bond-site of the first conductive member and a second wire-bond line from the signal bond-pad to the second bond-site of the second conductive member, the first and second wire-bond lines being immediately adjacent to one another without an interposing wire-bond line from another bond-pad on the microelectronic die being between the first and second wire-bond lines.

14. The microelectronic device assembly of claim 13 wherein the support structure is a lead frame comprising a perimeter frame section and the plurality of conductive members, wherein the plurality of conductive members are leads attached to the perimeter frame section proximate to the second ends of the conductive members.

15. The microelectronic device assembly of claim 13 wherein the support structure is an interposing substrate comprising a printed circuit sheet and the plurality of conductive members, the printed circuit sheet having an opening with a first side and a second side, and wherein the bond-sites of the conductive members are contact pads arranged along at least one of the first side or the second side of the opening through the sheet, the external connectors of the conductive members are solder ball-pads, and the elongated sections of the conductive members are conductive traces extending from the bond-sites to the ball-pads.

16. The microelectronic device assembly of claim 13, further comprising a shield between the first and second conductive members.

17. The microelectronic device assembly of claim 16 wherein the shield between the first and second conductive members comprises a conductive line coupled to a voltage potential.

18. The microelectronic device assembly of claim 16 wherein the shield between the first and second lines comprises a dielectric barrier.

19. A microelectronic device assembly, comprising:
a microelectronic die having an integrated circuit and a plurality of bond-pads coupled to the integrated circuit, the bond-pads including a reference voltage (Vref) bond-pad and a signal bond-pad proximate to the Vref bond-pad;
a support structure having a plurality of conductive members coupled to the die, each conductive member having a first end with a bond-site proximate to a corresponding bond-pad of the die, a second end with an external connector, and an elongated section connecting the bond-site to the external connector, the conductive members being arranged so that at least a portion of the bond-sites are in a first row proximate to one side of the bond-pads on the die, and the conductive members including a first conductive member, a second conductive member, and a third conductive member, the third conductive member coupled to an electrical potential and having a shielding section immediately adjacent to and between at least a portion of the first and second conductive members; and
a plurality of wire-bond lines including a first wire-bond line from the Vref bond-pad to the first bond-site of the first conductive member and a second wire-bond line from the signal bond-pad to the second bond-site of the second conductive member.

20. The microelectronic device assembly of claim 19 wherein the support structure is a lead frame comprising a perimeter frame section and the plurality of conductive members, and wherein the plurality of conductive members are leads attached to the perimeter frame section proximate to the second ends of the conductive members.

21. The microelectronic device assembly of claim 19 wherein the support structure is an interposing substrate comprising a printed circuit sheet and the plurality of conductive members, the printed circuit sheet having an opening with a first side and a second side, and wherein the bond-sites of the conductive members are contact pads arranged along at least one of the first side or the second side of the opening through the sheet, the external connectors of the conductive members are solder ball-pads, the elongated sections of the conductive members are conductive traces along the sheet extending from the bond-sites to the ball-pads, and the contact pads and traces of the first and second conductive members are spaced apart from one another by at least the second gap width.

22. The microelectronic device assembly of claim 19, further comprising a shield between the first and second conductive members.

23. The microelectronic device assembly of claim 22 wherein the shield between the first and second conductive members comprises a conductive line coupled to a voltage potential.

24. The microelectronic device assembly of claim 22 wherein the shield between the first and second lines comprises a dielectric barrier.

* * * * *